United States Patent
Hirakawa

[19]

[11] Patent Number: 6,040,984
[45] Date of Patent: *Mar. 21, 2000

[54] PRINTED CIRCUIT BOARD WITH OPPOSED BONDING SHELVES FOR SEMICONDUCTOR CHIP WIRE BONDING AT DIFFERENT LEVELS

[75] Inventor: Tadashi Hirakawa, Osaka, Japan

[73] Assignee: Fuji Machinery Mfg. & Electronics Co., Ltd., Osaka, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/805,175

[22] Filed: Feb. 26, 1997

[30]  Foreign Application Priority Data

Feb. 27, 1996 [JP] Japan .................................. 8-067258

[51] Int. Cl.[7] ...................................................... H05K 7/02
[52] U.S. Cl. ......................... 361/777; 361/709; 361/718; 361/719; 361/764; 361/772; 361/776; 361/783; 257/692; 257/698; 257/707; 257/784; 257/786; 174/261; 174/262; 438/121; 438/122; 29/832
[58] Field of Search .............................. 29/829, 831, 832, 29/850, 881; 174/254, 255, 260, 261, 262, 268; 228/179.1, 180.21, 180.22, 180.5; 257/668, 675, 690, 692, 698, 707, 712, 713, 723, 728, 737, 738, 774, 778, 784, 786; 361/704, 707, 709, 712, 714, 718, 719, 720, 749, 760, 761, 764, 772, 774, 776, 777, 779, 783, 818; 438/121, 122, 123, 613, 617

[56]  References Cited

U.S. PATENT DOCUMENTS 5,474,957  12/1995  Urushima ................................ 438/122
5,663,530   9/1997  Schueller et al. ....................... 174/260

FOREIGN PATENT DOCUMENTS 62-156847  7/1987  Japan .
62-216250  9/1987  Japan .
63-52430   3/1988  Japan ............................ 438/FOR 369
4-199563   7/1992  Japan .................................. 257/666.2

Primary Examiner—Leo P. Picard
Assistant Examiner—John B. Vigushin
Attorney, Agent, or Firm—Skjerven, Morrill, MacPherson, Franklin & Friel LLP

[57]  ABSTRACT

High density bonding pads in a printed circuit board for mounting a semiconductor chip are provided using a simple structure and at a low cost, while minimizing the difference in levels of bonding pads. A printed circuit board for mounting semiconductor chip(s) includes conductive traces on both sides of a base material, the first traces on a first surface of the base material having first bonding pads, the second traces on a second opposite surface of the base material having the second bonding pads. The bonding pads are located in rows adjacent each other with the base material having openings leading to the second bonding pads, such that chip bonding wires are connectible from the chip directly to the first bonding pads and through the openings to the second bonding pads.

21 Claims, 2 Drawing Sheets

PRINTED CIRCUIT BOARD WITH OPPOSED BONDING SHELVES FOR SEMICONDUCTOR CHIP WIRE BONDING AT DIFFERENT LEVELS

FIELD OF THE INVENTION

This invention is related to the structure of printed circuit boards. More precisely, this invention is related to the structure of bonding pads for wire bonding in mounting semiconductor chips on the printed circuit boards.

BACKGROUND OF THE INVENTION

Conventionally, wire bonding by gold wire have been used to mount semiconductor chips on the printed circuit boards. The gold wire is connected on both ends with electrodes located on the semiconductor chip and the printed circuit board.

As the lead count of semiconductor chips increases, and the pad pitch on the chip decreases, the pad pitch on the printed circuit boards is decreasing. Hence, the pad density of the recent printed circuit boards is so high that it is almost impossible to manufacture with the ordinary printed circuit board technology. Multilayer boards and multiple bonding shelves have been developed to alleviate the pad density on the printed circuit boards.

These printed circuit boards have been made by technologies such as laminating boards having preformed larger and smaller openings and by fabricating a printed circuit board with bonding shelves (e.g. Japan Examined Patent 2-5014, Japanese Examined Patent 5-41039), or by laminating prefabricated cores to form multilayer boards, and etching the opening by a laser (applied by the author, Japanese Application Patent 7-171391). The conventional printed circuit boards having multiple bonding shelves mentioned above were complex in manufacturing technology, and also costly, and a less expensive process is desired. On the other hand, some problems were left in wire bonding, since the multiple bonding pads had level differences.

This invention aims to solve the problems inherent in conventional printed circuit boards. The objective of this invention is to provide printed circuit boards for mounting semiconductor chips which can be fabricated in a simple manner with inexpensive cost while maintaining high density bonding pads, and also keeping the level difference to a minimum to make wire bonding easy.

SUMMARY OF THE INVENTION

The printed circuit board for mounting semiconductor chips in this invention is a printed circuit board having conductive traces on both sides. The circuit traces are formed by copper or other electrically conductive foil on a first surface of the base material A. The traces include first bonding pads facing outwardly from the first surface of the base material. A circuit is also formed by copper foil on the second opposite surface of the base material A including second bonding pads accessible through openings formed in the base material A. The first and second bonding pads are located adjacent to each other on opposite sides of the base material to form two rows of bonding pads.

A printed circuit board for mounting a semiconductor chip or chips includes a base material or substrate; a series of conductive traces formed of conductive foil, such as copper foil, on both sides as the base material, the traces on a top first surface of the base material having first bonding pads on an exposed side of the conductive foil, the traces on a second surface layer 11 of the base material having second bonding pads on the top side of the conductive foil. The first and second bonding pads are located in rows adjacent to each other. A series of openings are provided in the base material adjacent to the first bonding pads and leading to the second bonding pads. Bonding wires are connectable directly from connector pads of a chip to respective first bonding pads and through the openings to respective second bonding pads. A resin encapsulant (not shown) as known in the art, is normally then molded about the traces, the chip(s) and the bond wires forming a device package, with suitable leads extending from the package.

DETAILED DESCRIPTION

Figure 1:
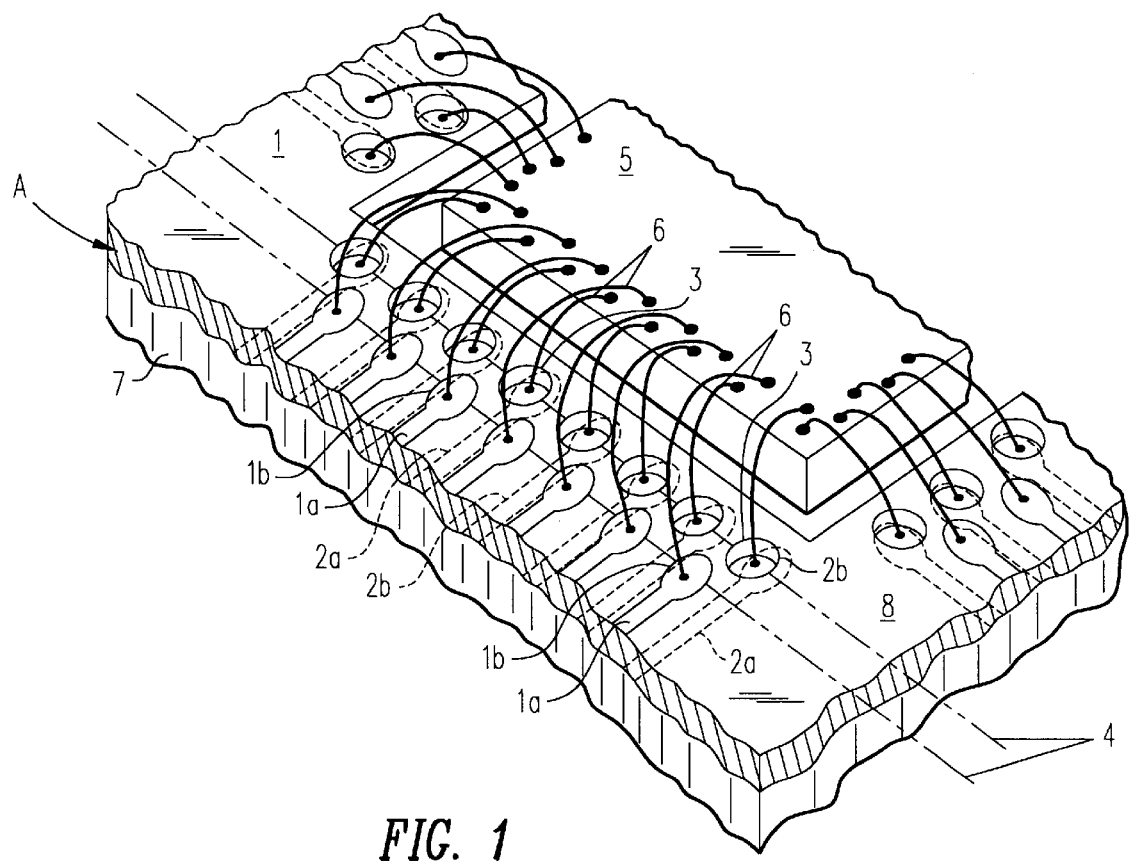
FIG. 1 is a perspective view of a portion of the printed circuit board of this invention with a semiconductor chip mounted.

The printed circuit board of this invention is a double sided board having bonding pads 1b, 2b as a part of a circuit. The pads are formed by copper foil 1a, 2a formed on the first and the second surfaces 1, 2 of the base material A, respectively.

The base material A or substrate used here may be a laminate including reinforcements or film or sheet not including reinforcements.

In case the base material A includes reinforcement, glass fibers, ceramic fibers or organic fibers can be used for reinforcement. As organic fibers, aramid fibers, poly-etherketone fibers, polybenzimidazore fibers, etc. can be used. For aramid fibers, poly-paraphenylene terephthalamide fibers and copoly-paraphenylene 3, 4' oxydiphenylterephthalamide fiber can be used. The latter fiber is preferable because of higher purity of the fiber and higher reliability of the board formed thereof.

In case the reinforcement is not used, i.e., in case film or sheet is used, heat resistant thermosetting films such as polyimide, aramide, polybenzimidazore including polyamic acid, poly-bismaleimide triazine can be used. Moreover, as thermoplastic films, polyester, polyamide, polycarbonate, etc. can be used.

On the first and the second surfaces 1, 2, copper foil circuits 1a, 2a with a thickness of 5–20 microns is formed. Lamination of copper foil can be made either by laminating prepregs, using adhesive layers 11, 12, hot pressing by use of a thermoplastic behavior of base material A, coating resins on the back of copper foils and dry-curing, and other methods.

Patterning for forming each circuit 1a, 2a, and bonding pads 1b, 2b can be made by the ordinary subtractive method. The additive method shown in the art can also be applied as long as the final structure meets the objective of this invention.

Figure 2:
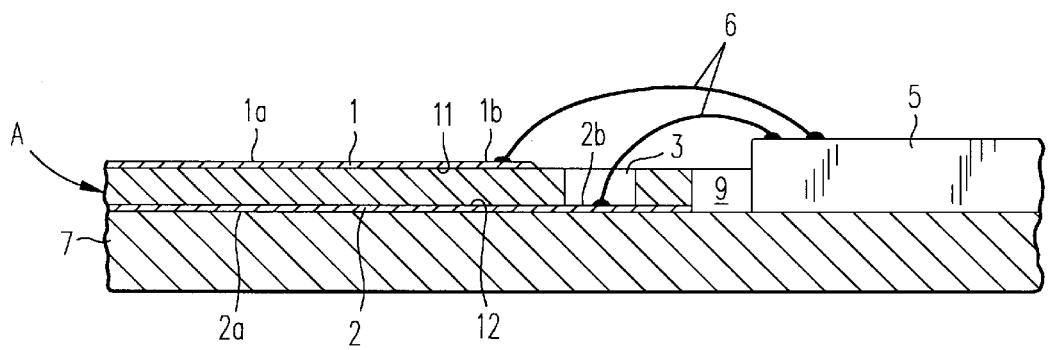
FIG. 2 is an enlarged side view partially in section of the printed circuit board of this invention with semiconductor chip mounted.

The above-mentioned second bonding pads 2b are formed on the same surface as the adhesive layer 12, which means that the pads are formed on the side of the adhesive layer 11 facing the base material A, and the first bonding pads 1b are formed on the top side of the adhesive layer 11, which means that the pads are formed on the side opposite from the side of the adhesive layer 11 facing the base material (FIG. 2). The location of openings formed on the base material A correspond to each location of forming the second bonding pads 2b. Viewing the plan views, the second bonding pads 2b are formed adjacent to the first bonding pads 1b (FIG. 3) in separate parallel rows, or they are formed in staggered pairs between staggered pairs of the first bonding pads 1b (FIG. 4).

The opening 3 is formed by opening only the base material A from one side, i.e. the first surface 1. Means of opening can be either mechanical punching, laser etching, or chemical etching.

In the case of the base material A being opened by mechanical punching, the base material with adhesive attached is opened prior to lamination of the copper foil to both sides of the base material, i.e. on the first surface 1a and the second surface 2a, and after that pattern-etching the traces and bonding pads. In an alternative, the copper foils can be attached to the base material prior to punching.

When the openings are made by laser etching, the laser can be a carbon dioxide laser, a YAG laser, or an excimer laser. It is preferable to use an impact laser, which is a kind of carbon dioxide laser, a YAG laser, or an excimer laser, to form the walls and trenches and holes cleanly.

In any case, the laser beam is focused in a certain area, and applied from the top of the base material A. To limit the application area, a mask image method, a contact mask method, or a conformal mask method can be used. For application, forming patterns by applying the laser to a large area at once, or moving a small focused beam along the predetermined patterns, or scanning a small focused beam can be used.

The location of the first bonding pads 1b formed on the first surface of the base material A and the second bonding pads 2b formed on the second surface of the base material A result in rows on each surface 1. Viewing the plan view, the row 4 of the first bonding pads 1b and the row 4 of the second bonding pads 2b can be arranged in parallel (FIG. 3), or they can be staggered in each surface 1, 2 of the base material A, and viewing the plan view, the first bonding pads 1b and the second bonding pads 2b can make a row alternately to form a row 4, 4, and to form the parallel two rows (FIG. 4).

Thus, a printed circuit board is formed, wherein the circuit 1a is formed by copper foil formed on the first surface 1 of the base material A with the bonding pads 1b on the top side of the adhesive surface with the copper foil, i.e. on the exposed adhesive surface, and the circuit formed by copper foil 2a is formed on the second surface 2 on the base material A which has the bonding pads 2b on the same side of the adhesive surface with the copper foil, thus forming two rows of bonding pads.

The order of processes such as adhesion of copper foil to the base material A, patterning, and opening can be in any order as long as the final structure meets the objective of this invention. The circuit 1a by copper foil formed on the first surface 1 and the circuit 2a by copper foil formed on the second surface 2 can be electrically connected by through-holes or blind via-holes. Through-holes penetrating the copper foils 1,2 and the base material and the via holes penetrating just the one copper foil and not penetrating the other copper foil are formed, and copper-plated to electrically connect the circuit 1a and 1b on both sides 1,2. The hole making can be before or after the formation of bonding pads, which is the major objective of this invention.

Moreover, in forming holes by lasers, the bonding pads and the via holes may be formed at the same time. The most preferable form is to make vias first, and after completing the copper plating, a part of the first surface is etched, and the laser beam is applied through these etched parts to form bonding pads. Gold plating on the pads can be done in the final stage.

As stated above, the printed circuit board for mounting semiconductors of this invention is different from the conventional bonding shelves. High density bonding pads 1b and 2b can be made rather easily, and can cope with higher density and smaller lead pitch of semiconductor chips 5. For this printed circuit board, film or sheet can be used for base material A, and the level difference between the first bonding pad 1b and the second bonding pad 2b is only the thickness of the base material, which is very thin. Thus high speed wire bonding operation with bonding wires 6 between the semiconductor chip 5 and the bonding pads 1b and 2b can be made without any problems.

EXAMPLES

As a base material, film with no reinforcement is used, and a printed circuit board for mounting semiconductor chips is obtained using laser etching to form opening 3 on the base material A.

As the base material, a polyimide film with a thickness of 40 microns having copper foils with a thickness of 18 microns is attached and laminated on the first surface and the second surface of the base material.

Then, opening for laser etching is formed by chemical etching of copper foil on the first side 1 of the base material A. This opening corresponds to the location of the second bonding pads 2b on the second surface of the base material A.

The opening is preferably an elongated circle, i.e. an oval, having a longer diameter of about 250 microns and a shorter diameter of 70 microns. The disposition of opening can be any form, but the openings are arranged here so that the second bonding pad 2b on the second surface 2 of the base material is alternately located as viewed in a plan view, and the row for the first bonding pads 1b and the row for the second bonding pads 2b result in two rows in parallel.

Then, opening 3 is formed by laser-etching the base material A from the opening on the copper foil on the first surface 1 of the base material A. Here, an ultra-violet excimer laser beam with a wave length of 254 nm is applied. The copper foil on attached to the second surface 2 is left unetched.

Then, the copper foils on the first surface 1 and the second surface 2 of the base material A are pattern-etched to form circuits 1a, 2a, and at the same time to form the first bonding pads 1b and the second bonding pads 2b. Here, each second bonding pad 2b is kept a little larger than the opening 3 of the base material A. This pattern-etching is usually made in the final stage, however, since the opening 3 of the base material A is made by a laser, pattern-etching can be made at the same time as etching of the opening for laser etching in the initial stage.

Figure 3:
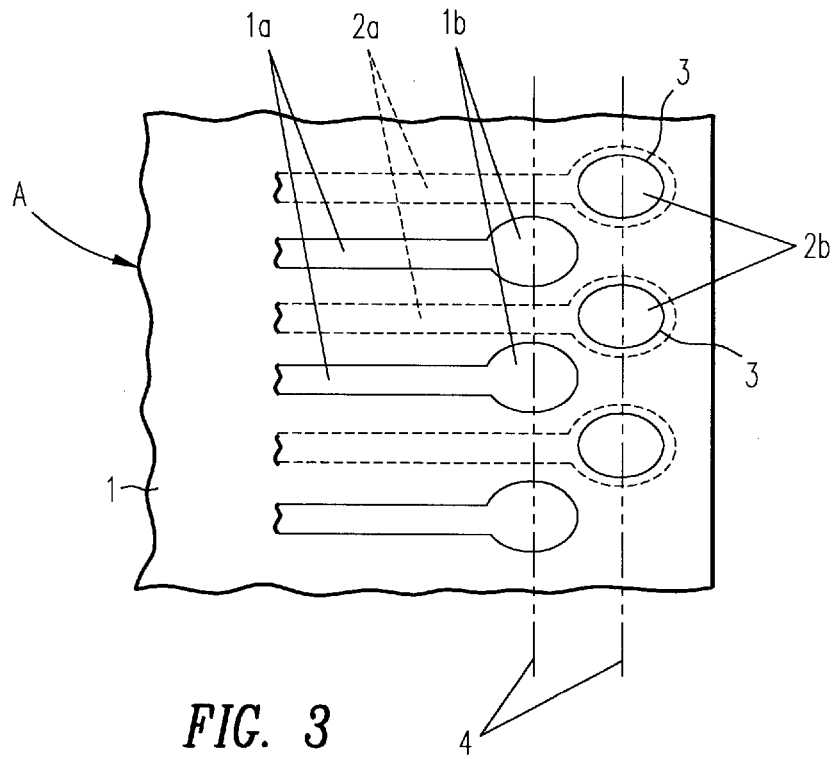
FIG. 3 is a plan view of a portion of the printed circuit board of this invention with enlarged bonding pads.
Figure 4:
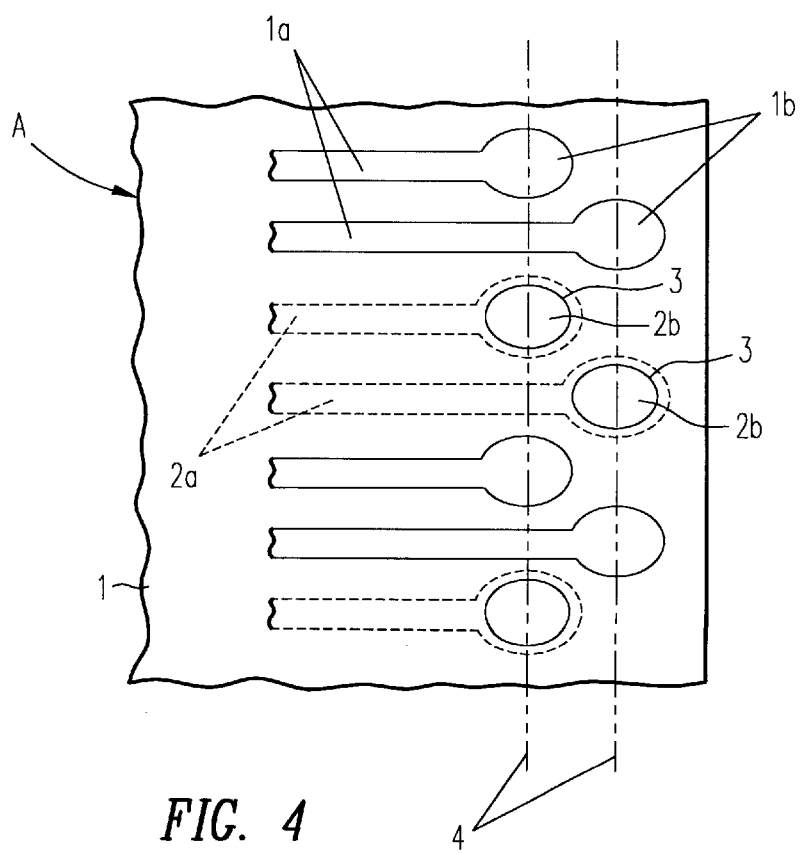
FIG. 4 is a plan view of a portion of the printed circuit board of this invention with bonding pads of a second embodiment.

Thus, the first bonding pads 1b on the first surface 1 of the base material and the second bonding pads 2b on the second surface 2 of the base material result in staggered rows with a pitch of about 150 microns, and as seen in a plan view, the row for the first bonding pads 1b and the second bonding pads 2b result in two parallel rows (FIG. 3).

The first and the second bonding pads 1b and 2b preferably have a width of about 50–120 microns and a length of about two times as large as the width. The first bonding pads 1b are designed to have these scaled dimensions, but the second bonding pads 2b are determined by the size of the opening 3 of the base material A. Then, as a finish, solder mask is applied as needed, and Ni/Au plating is formed on the first and the second bonding pads 1b and 2b The thicknesses of the Ni and Au platings are preferably more than 3 microns, namely from 3 to about 10 microns, and 0.3 micron, namely from 0.3 to about 1.0 micron, respectively. Since a film is used as a base material A in this example, a stiffener plate 7 is attached afterwards on the second surface 2 of the base material A. The stiffener 7 may be a metal plate insulated by adhesive from the copper foil 2, 2a and by suitable adhesive (not shown) under chip 5 or may be made from thermoplastic or thermosetting insulative or conductive resin. The chip 5 may be mounted on the stiffener 7 with the base material A in the form of a rectangular ring 8 surrounding the chip or, if multiple chips are employed, the chips are mounted in cutouts 9 in the base material.

Thus, a printed circuit board having an extremely high density was fabricated, having the first bonding pads 1b and the second bonding pads 2b with a pitch of 150 micron, making two rows in parallel. The level difference of the first bonding pads and the second bonding pads was kept as small as the thickness of the base material, which is about 40 microns. Thus, wire bonding to the semiconductor chip 5 can be made with no problem.

Different from the above example, the base material A can include reinforcement, and opening of the base material A can be made by punching or by chemical etching. The first bonding pads 1b and the second bonding pads 2b may be aligned in rows with each other, or in the parallel rows of bonding pads (FIG. 4). As a matter of course, thickness and dimensions mentioned above are just examples, and they are not limited to these figures.

As is clear from the above mentioned description, the printed circuit board for mounting semiconductor chips of this invention can be fabricated with rather simple methods, and can form high density bonding pads, and can cope with higher density semiconductor chips and finer leads. Since thin film can be used, the difference of the first bonding pads and the second bonding pads is small, and extremely high speed wire bonding operation for semiconductor chips can be made.

Conventionally, to cope with higher density semiconductor chips and increase of lead count, printed circuit boards for multiple wire bonding shelves have been made by making multilayer boards, and the manufacturing technology was very complicated and costly. On the other hand, in the printed circuit board of this invention, the copper circuit attached on the first surface of the base material has bonding pads on the back side of the adhesive surface of the copper foil, and the copper circuit on the second surface of the base material has the second bonding pads through the opening formed on the base material, and these bonding pads are arranged in adjacent to form rows of bonding pads.

For this reason, the printed circuit board of this invention can be made easily with a simple process, while having high density, and the manufacturing cost can be reduced. Since film can be used for the base material, the level difference of the first bonding pads and the second bonding pads are as small as the thickness of the said base material, the wire bonding operation can be made with high speed.

The above description of embodiments of this invention is intended to be illustrative and not limiting. Other embodiments of this invention will be obvious to those skilled in the art in view of the above disclosure.

I claim:

1. In combination, a semiconductor chip; a printed circuit board; and bonding wires connecting the chip to the printed circuit board; said printed circuit board comprising a base material, a series of conductive traces of conductive foil on both sides of the base material, the traces on a first surface of the base material forming a first bonding shelf having first bonding pads, the traces on an opposite second surface of the base material forming a second bonding shelf having second bonding pads, said first and second bonding pads being located in rows adjacent to each other separated by said base material, a series of openings in said base material adjacent to said first bonding pads and each leading to a respective one of said second bonding pads on said second bonding shelf, and wherein the bonding wires are connectable directly from the chip to said first bonding pads on said first bonding shelf and through said openings to said second bonding pads on said second bonding shelf.

2. A printed circuit board for mounting a semiconductor chip comprising a base material; a series of conductive traces of conductive foil on both sides of the base material, the traces on a first surface of the base material fonning a first bonding shelf having first bonding pads, the traces on an opposite second surface of the base material forming a second bonding shelf having second bonding pads, said first and second bonding pads being located in spaced rows adjacent to each other and spaced from a side of the chip, a series of openings in said base material adjacent to said first bonding pads and each leading to a respective one of said second bonding pads; and wherein bonding wires are connectable directly from a chip to said first bonding pads on said first bonding shelf and through said openings to said second bonding pads on said second bonding shelf.

3. The printed circuit board as defined in claim 1 wherein the opening is a punched opening.

4. The printed circuit board as defined in claim 1 wherein the opening is a laser-made opening.

5. The printed circuit board as defined in claim 1 wherein the opening is an excimer laser-made opening.

6. The printed circuit board as defined in claim 1 wherein the opening is a carbon dioxide laser-made opening.

7. The printed circuit board as defined in claim 1 wherein the first bonding pads formed on the first surface of the base material are in one row and the second bonding pads formed on the second surface of the base material are in a second row, the two rows being located in parallel.

8. The printed circuit board as defined in claim 1 wherein the first bonding pads formed on the first surface of the base material and the second bonding pads formed on the second surface of the base material are located in staggered rows on each surface, the first bonding pads and the second bonding pads being located in two parallel rows.

9. The printed circuit board as defined in claim 8 wherein a staggered pair of the second bonding pads extend between a first pair of staggered first bonding pads and a second pair of staggered first bonding pads.

10. The printed circuit board as defined in claim 1 wherein said first bonding pads and said second bonding pads are staggered with respect to each other such that a high density of first and second bonding pads is attained.

11. The printed circuit board as defined in claim 1 wherein a level difference between said first bonding shelf and said second bonding shelf is a thickness of the base material.

12. A multilayered printed circuit board having a plurality of bonding shelves for mounting a semiconductor chip comprising:

a base material;

a series of first conductive traces of conductive foil on one side of the base material and a series of second conductive traces on the opposite side of the base material, the first conductive traces on one surface of the base material forming a first bonding shelf having first bonding pads, the second conductive traces on an opposite surface of the base material forming a second bonding shelf having second bonding pads, said first and second bonding pads being located in spaced rows adjacent to each other and spaced from a side of the chip;

a series of openings in said base material adjacent to said first bonding pads and each leading to a respective one of said second bonding pads; and bonding wires extending from the side of the chip connectable directly from the chip to said first bonding pads on said first bonding shelf and through said openings to said second bonding pads on said second bonding shelf, such that adjacent bonding wires alternate from being connected to the first bonding shelf and to the second bonding shelf.

13. The multilayered printed circuit board of claim 12 further comprising:

the first conductive traces, formed of a conductive material, having a first side and a second side, with the first side adhesively bound to the one surface of the base material and the first bonding pad of each respective first conductive trace formed on the second side of the respective first conductive trace; and the second conductive traces, formed of a conductive material, having a first and a second side, with the first side adhesively bound to the opposite surface of the base material and the second bonding pad for each respective second conductive trace formed on the first side of the respective second conductive trace.

14. The multilayered printed circuit board of claim 13 wherein the base material comprises a thin film of insulative material.

15. The multilayered printed circuit board of claim 14 wherein the thin film is a polyimide film.

16. The multilayered printed circuit board of claim 13 wherein the second bonding pads are larger in area than the respective opening leading to the respective bonding pad and positioned such that the entire such respective opening overlies some part of the respective bonding pad.

17. In combination, a semiconductor chip; a multilayered printed circuit board having a plurality of bonding shelves; and bonding wires connecting the chip to the printed circuit board; said printed circuit board comprising:

a base material;

a series of first and second conductive traces of conductive foil on both sides of the base material, the first traces on a first surface of the base material forming a first bonding shelf having first bonding pads, the second traces on an opposite second surface of the base material forming a second bonding shelf having second bonding pads, said first and second bonding pads being located in rows adjacent to each other separated by said base material;

a series of openings in said base material adjacent to said first bonding pads and each leading to a respective one of said second bonding pads on said second bonding shelf; and wherein the bonding wires are connectable directly from the chip to said first bonding pads on said first bonding shelf and through said openings to said second bonding pads on said second bonding shelf, such that adjacent bonding wires alternate from being connected to the first bonding shelf and to the second bonding shelf.

18. The multilayered printed circuit board of claim 17 further comprising:

the first conductive traces, formed of a conductive material, having a first side and a second side, with the first side adhesively bound to the one surface of the base material and the first bonding pad of each respective first conductive trace formned on the second side of the respective first conductive trace; and the second conductive traces, formed of a conductive material, having a first and a second side, with the first side adhesively bound to the opposite surface of the base material and the second bonding pad for each respective second conductive trace formed on the first side of the respective second conductive trace.

19. The multilayered printed circuit board of claim 18 wherein the base material comprises a thin film of insulative material.

20. The multilayered printed circuit board of claim 19 wherein the thin film is a polyimide film.

21. The multilayered printed circuit board of claim 20 wherein the second bonding pads are larger in area than the respective opening leading to the respective bonding pad and positioned such that the entire such respective opening overlies some part of the respective bonding pad.

* * * * *